(12) United States Patent
Wittenberg et al.

(10) Patent No.: US 8,988,890 B2
(45) Date of Patent: Mar. 24, 2015

(54) COMPONENT MOUNTING STRUCTURES WITH BREAKAWAY SUPPORT TABS

(75) Inventors: Michael B. Wittenberg, Sunnyvale, CA (US); Jared M. Kole, San Francisco, CA (US); Sawyer I. Cohen, Sunnyvale, CA (US); Shayan Malek, San Jose, CA (US)

(73) Assignee: Apple Inc., Cupertino, CA (US)

(*) Notice: Subject to any disclaimer, the term of this patent is extended or adjusted under 35 U.S.C. 154(b) by 314 days.

(21) Appl. No.: 13/598,308

(22) Filed: Aug. 29, 2012

(65) Prior Publication Data

US 2014/0063769 A1 Mar. 6, 2014

(51) Int. Cl.
*H05K 7/00* (2006.01)

(52) U.S. Cl.
USPC .................................. 361/760; 29/832

(58) Field of Classification Search
USPC .............. 361/679.01, 760; 29/592.1, 825, 29/829–841
See application file for complete search history.

(56) References Cited

U.S. PATENT DOCUMENTS

| | | | | |
|---|---|---|---|---|
| 635,091 | A * | 10/1899 | Dyer | 228/44.3 |
| 3,452,976 | A * | 7/1969 | Ross | 269/91 |
| 3,828,402 | A * | 8/1974 | Gorman | 24/67.5 |
| 5,034,802 | A | 7/1991 | Liebes, Jr. et al. | |
| 5,318,212 | A * | 6/1994 | Becker et al. | 228/44.7 |
| 5,546,275 | A | 8/1996 | Moutrie et al. | |
| 5,598,775 | A * | 2/1997 | Vongfuangfoo et al. | 100/233 |
| 5,783,370 | A | 7/1998 | Groom et al. | |
| 5,820,013 | A * | 10/1998 | Ortiz | 228/43 |
| 5,937,512 | A * | 8/1999 | Lake et al. | 29/832 |
| 5,952,909 | A * | 9/1999 | Umeno et al. | 336/192 |
| 6,077,095 | A | 6/2000 | DelPrete et al. | |
| 6,233,159 | B1 | 5/2001 | Harman et al. | |
| 6,237,832 | B1 * | 5/2001 | Chung | 228/44.7 |
| 6,335,671 | B1 * | 1/2002 | Roessler et al. | 336/65 |
| 6,353,998 | B1 * | 3/2002 | Cox et al. | 29/840 |
| 6,378,857 | B1 * | 4/2002 | Taylor | 269/47 |
| 6,412,768 | B1 * | 7/2002 | Peckham et al. | 269/203 |
| 6,799,714 | B2 * | 10/2004 | Gleason | 228/212 |
| 7,015,066 | B2 * | 3/2006 | Tsao et al. | 438/108 |
| 7,036,214 | B2 * | 5/2006 | Kondo et al. | 29/830 |
| 7,166,252 | B2 * | 1/2007 | Gochnour et al. | 264/272.14 |
| 7,229,000 | B2 * | 6/2007 | Wang et al. | 228/49.5 |
| 7,326,857 | B2 * | 2/2008 | Germann et al. | 174/255 |
| 7,464,853 | B2 * | 12/2008 | Buchheit et al. | 228/112.1 |
| 2001/0008043 | A1 * | 7/2001 | Daido et al. | 29/834 |
| 2001/0054481 | A1 * | 12/2001 | Harada et al. | 156/289 |
| 2003/0110627 | A1 * | 6/2003 | Ferber et al. | 29/842 |
| 2004/0070959 | A1 * | 4/2004 | Sakai | 361/792 |
| 2004/0177497 | A1 * | 9/2004 | Peckham et al. | 29/830 |
| 2012/0269599 | A1 * | 10/2012 | Malek et al. | 411/427 |

* cited by examiner

*Primary Examiner* — Adrian S Wilson
(74) *Attorney, Agent, or Firm* — Treyz Law Group; Kendall P. Woodruff

(57) ABSTRACT

Components may be mounted to printed circuit substrates using solder. A breakaway support tab may be detachably connected to a component and may help prevent the component from shifting or toppling over during reflow operations. The component and breakaway support tab may be formed from sheet metal. The interface that links the component to the breakaway support tab may be perforated or half sheared to allow the breakaway support tab to be easily separated from the component following reflow operations. The breakaway support tab may be fixed in place during reflow operations by mechanically coupling the breakaway support tab to a fixture or by mounting the breakaway support tab to an unused portion of a panel of printed circuit substrates. A breakaway support tab may be mechanically coupled between two components on a printed circuit substrate and may be used to maintain a distance between the components during reflow operations.

17 Claims, 14 Drawing Sheets

US 8,988,890 B2

COMPONENT MOUNTING STRUCTURES WITH BREAKAWAY SUPPORT TABS

BACKGROUND

This relates to electronic components and, more particularly, to mounting electronic components onto substrates such as printed circuit substrates.

Components such as integrated circuits, attachment structures, stiffeners and other electronic devices and structures are typically mounted to printed circuit substrates using solder. In a typical arrangement, solder paste is printed onto conductive pads on the surface of the printed circuit substrate. A pick and place tool may then attach components to the substrate by placing components on the printed solder paste. Following placement of components on the substrate, the substrate may be conveyed into a reflow oven to convert the solder paste into solder connections.

In conventional arrangements, components on the printed circuit substrate shift during the reflow process as the solder melts. Components shifting during the reflow process can result in inaccurately placed components or can cause the components to topple over during reflow. Components with more complex shapes are sometimes soldered by hand after reflow, but this process often results in lower quality printed circuit arrangements and can adversely affect throughput.

It would therefore be desirable to be able to provide improved techniques for mounting components to printed circuits.

SUMMARY

Components may be mounted to printed circuit substrates using solder. A breakaway support tab may be detachably connected to a component and may be used to prevent the component from shifting with respect to the printed circuit substrate as solder melts during reflow operations.

Components and breakaway support tabs may be formed from sheet metal. An interface that links a component to a breakaway support tab may be perforated or half sheared to allow the breakaway support tab to be easily separated from the component following reflow operations.

A breakaway support tab may be mechanically coupled between two components on a printed circuit substrate and may be used to maintain a distance between the components during reflow operations. The breakaway support tab may be detachably connected to a first component at one end and detachably connected to a second component at a second end. Following reflow operations, the breakaway support tab may be detached from the components by severing the respective interfaces that link the components to the breakaway support tab.

A fixture may be used to hold the breakaway support tab in place during reflow operations. The fixture may include an engagement feature configured to receive a corresponding engagement feature on the breakaway support tab. By holding the breakaway support tab in place during reflow operations, the location of the component may remain fixed with respect to the printed circuit substrate during reflow operations.

Printed circuit substrates may be formed form a panel of printed circuit substrates. The panel may include multiple printed circuit substrates interposed between unused portions. Openings may be formed in the panel and may each partially surround an associated one of the printed circuit substrates. Components may be mounted to the panelized printed circuit substrates using solder and the panel may be conveyed into a reflow oven.

A breakaway tab may have a first portion detachably connected to a component on one of the printed circuit substrates and a second portion mounted to one of the unused portions of the panel. The breakaway tab may be used in stabilizing the component with respect the printed circuit substrate during reflow operations. Following reflow operations, the printed circuit substrates may be depanelized. The breakaway support tab may be separated from the component by severing or breaking a perforated or half-sheared interface that links the component to the breakaway support tab.

Further features of the invention, its nature and various advantages will be more apparent from the accompanying drawings and the following detailed description.

DETAILED DESCRIPTION

Components such as stiffeners, clips, and other structures may be mounted to a printed circuit using solder. Solder paste may be printed on the printed circuit using a stencil. A surface mount tool such as a pick and place tool may be used to attach the components to the substrate by placing components on the printed solder paste. Following placement of the components on the substrate, the substrate may be conveyed into a reflow oven to convert the solder paste into solder connections. Components that are mounted to printed circuit substrates in this way are sometimes referred to as surface mount technology (SMT) components.

The shifting of components as solder melts during reflow may be minimized by forming components with one or more detachable support tabs. Detachable support tabs may be used to align the center of mass of a component with a solder pad on which the component is mounted, thereby providing the component with greater stability during reflow. A detachable support tab may have a first portion detachably connected to a component and second end held in place by a fixture or soldered to an unused portion of a panel of printed circuits. Detachable support tabs may also be used to maintain a precise distance between components throughout the mounting process. Following reflow operations, the detachable support tab may be severed from the desired part.

Figure 1:
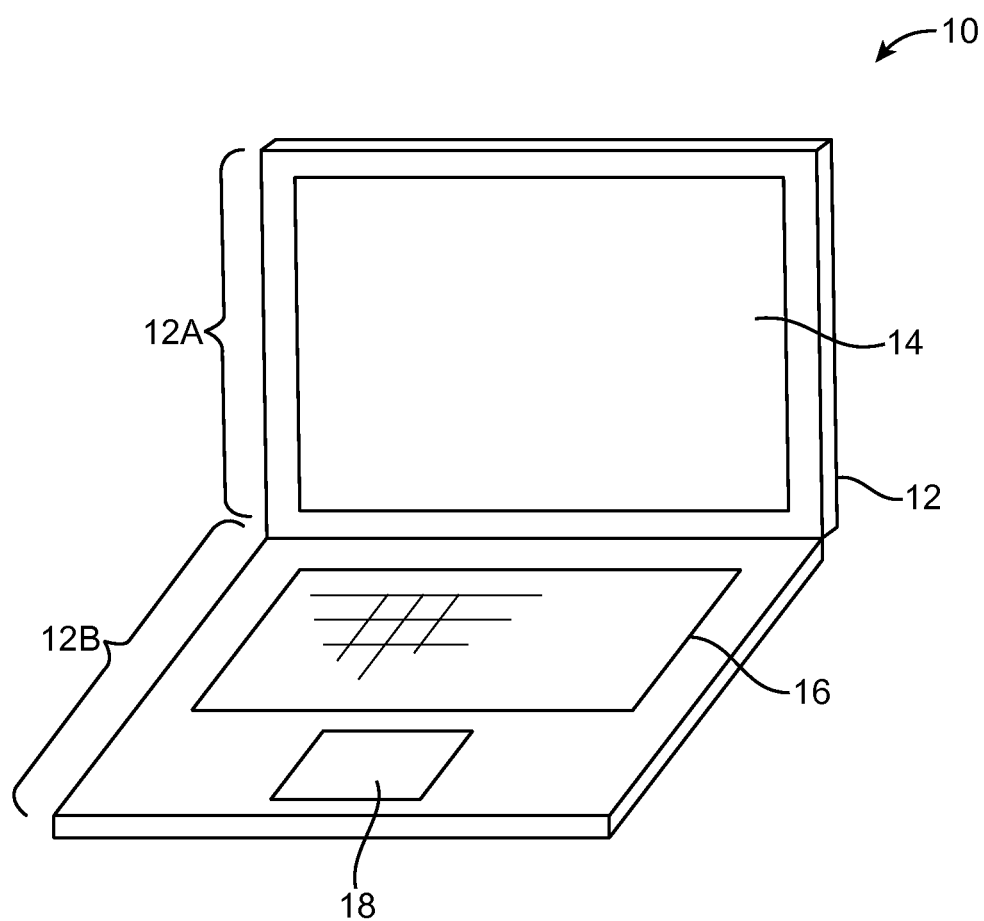
FIG. 1 is a perspective view of an illustrative electronic device such as a laptop computer with electronic device structures that may be assembled using threaded standoffs in accordance with an embodiment of the present invention.
Figure 2:
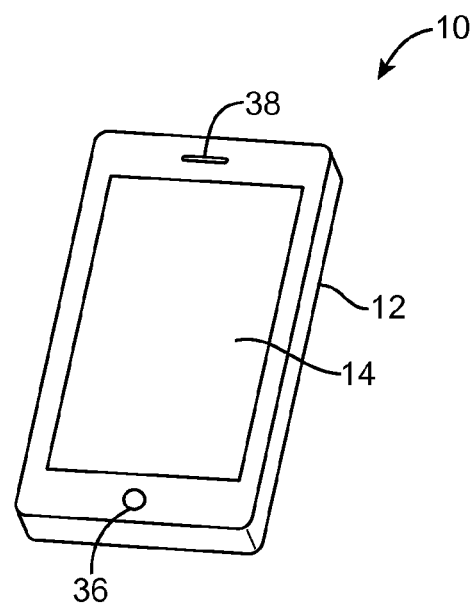
FIG. 2 is a perspective view of an illustrative electronic device such as a handheld electronic device with electronic device structures that may be assembled using threaded standoffs in accordance with an embodiment of the present invention.
Figure 3:
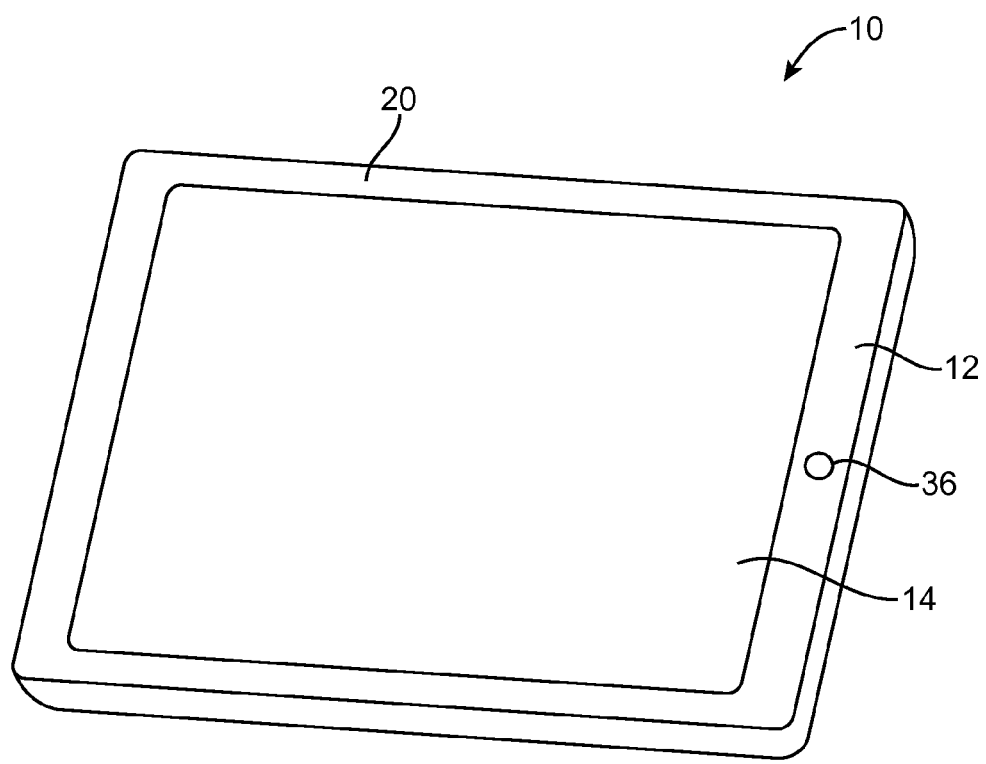
FIG. 3 is a perspective view of an illustrative electronic device such as a tablet computer with electronic device structures that may be assembled using threaded standoffs in accordance with an embodiment of the present invention.

Illustrative electronic devices that may be provided with SMT components are shown in FIGS. 1, 2, and 3. FIG. 1 shows how electronic device 10 may have the shape of a laptop computer having upper housing 12A and lower housing 12B with components such as keyboard 16 and touchpad 18. Assemblies such as printed circuit substrates having SMT components may be mounted within upper housing 12A and/or lower housing 12B.

FIG. 2 shows how electronic device 10 may be a handheld device such as a cellular telephone, music player, gaming device, navigation unit, or other compact device. In this type of configuration for device 10, housing 12 may have opposing front and rear surfaces. Display 14 may mounted on a front face of housing 12. Display 14 may, if desired, have a display cover layer or other exterior layer that includes openings for components such as button 36 and speaker port 38. Assemblies such as printed circuit substrates having SMT components may be mounted within housing 12.

FIG. 3 shows how electronic device 10 may be a tablet computer. In electronic device 10 of FIG. 3, housing 12 may have opposing planar front and rear surfaces. Display 14 may be mounted on the front surface of housing 12. As shown in FIG. 3, display 14 may have a cover layer or other external layer with an opening to accommodate button 36.

The configurations for device 10 shown in FIGS. 1, 2, and 3 are merely illustrative. In general, electronic device 10 may be a laptop computer, a computer monitor containing an embedded computer, a tablet computer, a cellular telephone, a media player, or other handheld or portable electronic device, a smaller device such as a wrist-watch device, a pendant device, a headphone or earpiece device, or other wearable or miniature device, a television, a computer display that does not contain an embedded computer, a gaming device, a navigation device, an embedded system such as a system in which electronic equipment with a display is mounted in a kiosk or automobile, equipment that implements the functionality of two or more of these devices, or other electronic equipment.

Device 10 may have a housing enclosure such as housing 12. Housing 12, which is sometimes referred to as a case or enclosure, may be formed of materials such as plastic, glass, ceramics, carbon-fiber composites and other composites, metal, aluminum, other materials, or a combination of these materials. Device 10 may be formed using a unibody construction in which most or all of housing 12 is formed from a single structural element (e.g., a piece of machined metal or a piece of molded plastic) or may be formed from multiple housing structures (e.g., outer housing structures that have been mounted to internal frame elements, welded standoffs, engagement structures, engagement member receiving structures, or other internal housing structures).

Device 10 may have one or more displays such as display 14. Display 14 may be a liquid crystal display, an organic light-emitting diode (OLED) display, or other suitable display. Display 14 may include display pixels formed from light-emitting diodes (LEDs), organic light-emitting diodes (OLEDs), plasma cells, electronic ink elements, liquid crystal display (LCD) components, and/or other suitable display pixel structures. Display 14 may, if desired, include capacitive touch sensor electrodes for a capacitive touch sensor array or other touch sensor structures (i.e., display 14 may be a touch screen).

Figure 4:
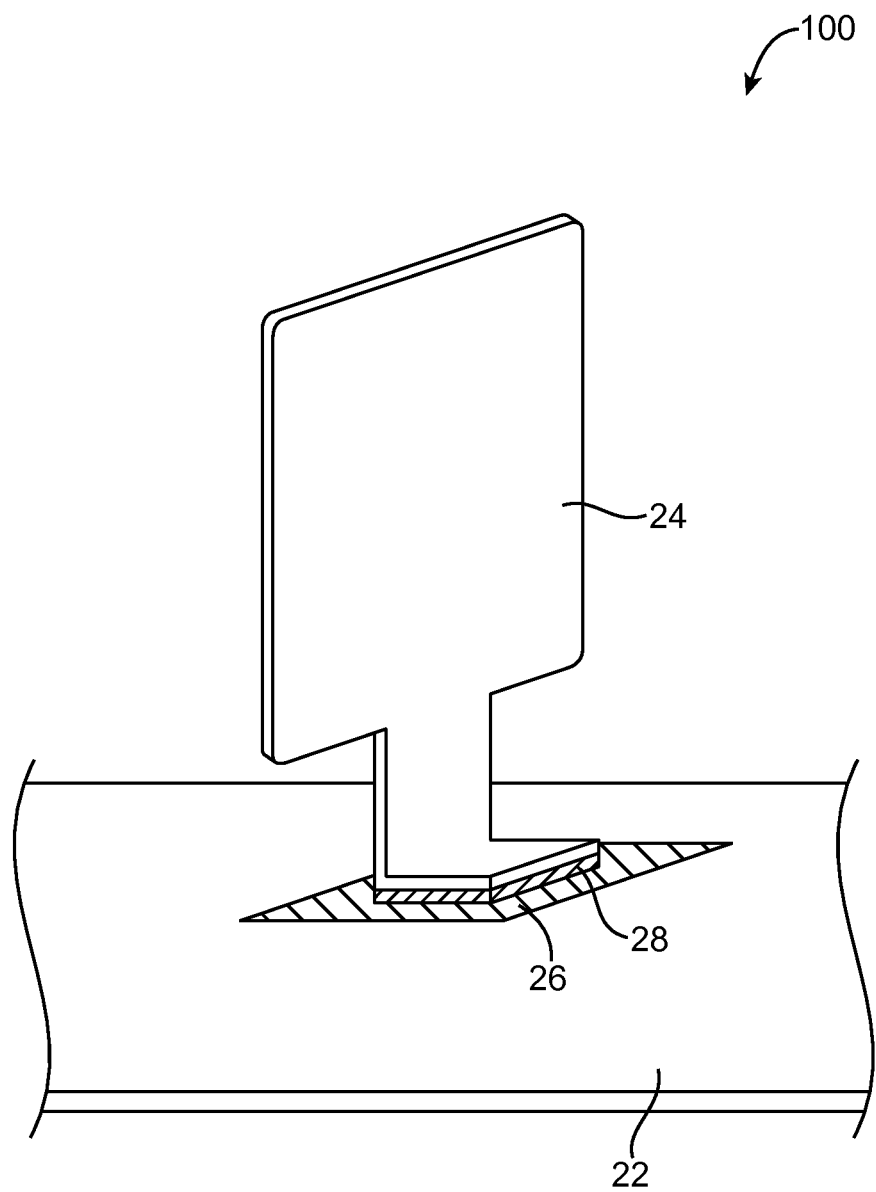
FIG. 4 is a perspective view of an illustrative component mounted to a printed circuit substrate using solder in accordance with an embodiment of the present invention.

A perspective view of an illustrative assembly that may be mounted in device 10 is shown in FIG. 4. As shown in FIG. 4, assembly 100 may include a printed circuit substrate such as printed circuit substrate 22. Printed circuit substrate 22 may include one or more layers of dielectric and one or more layers of conductor. Printed circuit 22 may, for example, be a flexible printed circuit formed from materials such as polyimide (sometimes referred to as a "flex circuit"), may be a rigid printed circuit board formed form a material such as fiberglass-filled epoxy (e.g., FR4), or may be formed from other suitable materials or combinations of these materials.

Components such as integrated circuits or other circuit components, batteries, cameras, compasses, wireless communications circuits, antennas, and other circuitry may be formed on or mounted to the surface of printed circuit substrate 22. Printed circuit substrate 22 may also include one or more structural components such as structural component 24. Structural components such as component 24 may include clips, stiffeners, connectors, attachment features, engagement members, and other structures. As examples, component 24 may be used in providing support for an acoustic module in device 10 or may provide a conductive path for tuning an antenna in device 10. Component 24 may, if desired, include one or more openings for receiving an engagement member (e.g., component 24 may serve as a washer or other engagement member receiving structure). Component 24 may be formed from metal, plastic, glass, ceramic, other suitable materials, or combinations of these materials. Component 24 may, for example, be formed from sheet metal (e.g., sheet metal formed from aluminum, steel, tin, nickel, brass, copper, titanium, other suitable metals, etc.).

Components such as component 24 may be mounted to conductive pads on printed circuit 22 such as solder pad 26.

Solder pad 26 may be formed from conductive material such as tin, lead, gold plated copper, or other suitable metals. Prior to mounting components to printed circuit 22, solder paste 28 may be applied to the surfaces of solder pads 26 on substrate 22 using a solder paste printing stencil. A pick and place tool may be used to mount components 24 on substrate 22 over solder pads 26 and solder paste 28.

Solder connections may be formed between component 24 and solder pad 26 by reflowing solder paste structures in a reflow oven, by heating solder paste or solder balls using a localized heat source such as a heat bar (hot bar) or heat gun, or using other suitable solder reflow techniques.

If care is not taken, molten solder on which components are placed can cause components to shift or become unstable during reflow operations. Complex or odd-shaped components may run the risk of toppling over during reflow operations. For example, a component may have a center of mass which is offset from the solder pad on which the component is mounted, which can lead to instability during reflow. Detachable support tabs may be used to support a component during reflow operations.

Figure 5:
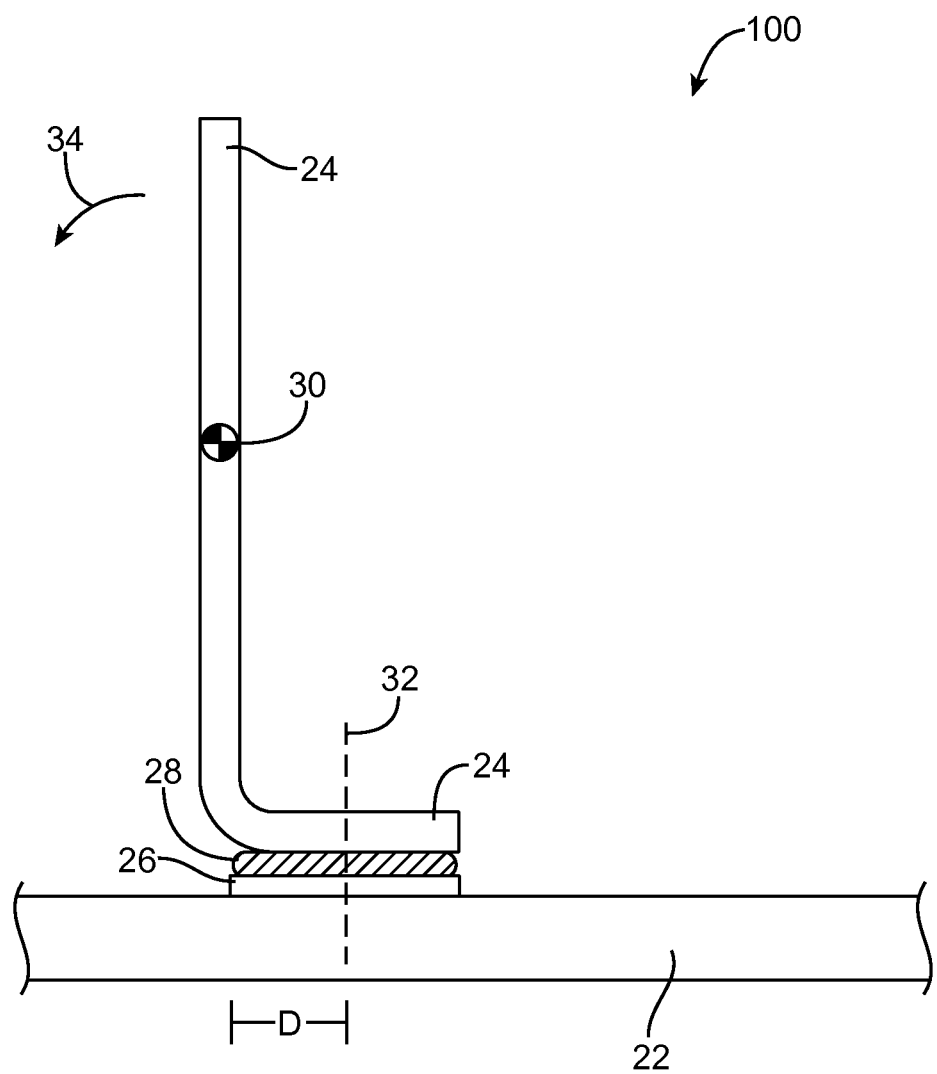
FIG. 5 is a side view of the arrangement shown in FIG. 4 in accordance with an embodiment of the present invention.

FIG. 5 is a side view of assembly 100 showing how center of mass 30 of component 24 may be offset by a distance D from central portion 32 of solder pad 26. To ensure that component 24 does not topple over in direction 34 during reflow operations, a detachable support tab may be attached to component 24 as component 24 undergoes the reflow process. Assembly 100 of FIG. 5 may be a post-reflow assembly in which a detachable support tab has been detached from component 24.

Figure 6:
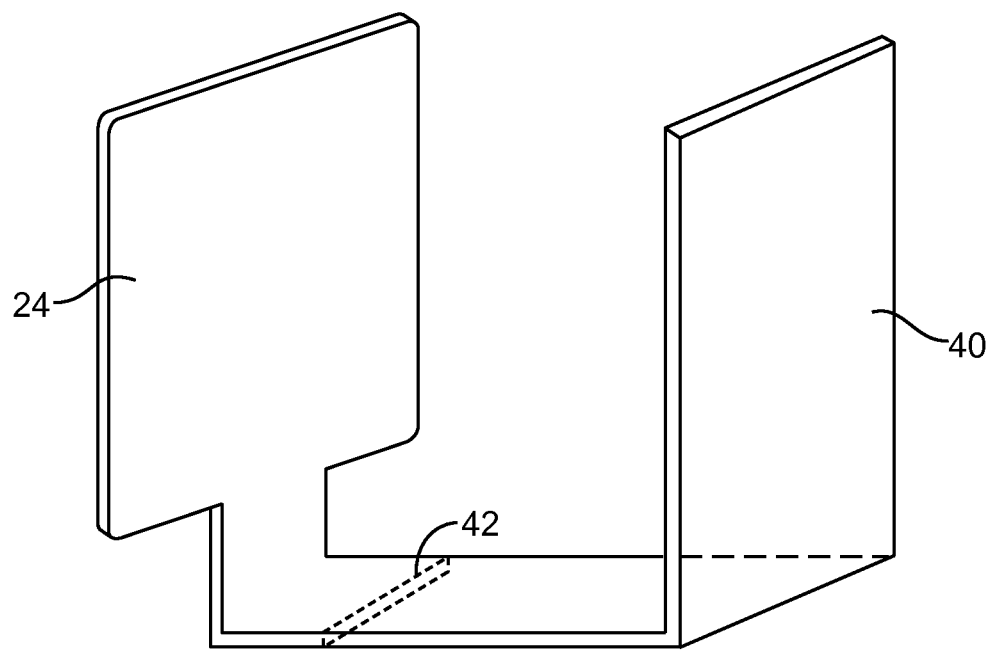
FIG. 6 is a perspective view of an illustrative breakaway support tab that is detachably connected to a component in accordance with an embodiment of the present invention.

FIG. 6 is a perspective view of component 24 showing how component 24 may be formed with a detachable support structure such as breakaway support tab 40. Support tab 40 may be a rigid but breakable structure that is detachably connected to component 24 at interface 42. Support tab 40 may be formed from any suitable material. Support tab 40 may, for example, be formed from the same material as component 24 (e.g., a single piece of sheet metal may be used to form component 24 and detachable support tab 40). This is, however, merely illustrative. If desired, support tab 40 may be formed from a separate structure and/or a different material and may be detachably connected to component 24 during reflow operations.

Support tab 40 may provide component 24 with increased stability during reflow operations by adjusting the center of mass of component 24. For example, support tab 40 (sometimes referred to as a balancing tab) may be used to align the center of mass of component 24 with the solder pad on which component 24 is mounted. Following reflow operations, support tab 40 may detached from component 24 by severing tab 40 at interface 42.

Figure 7:
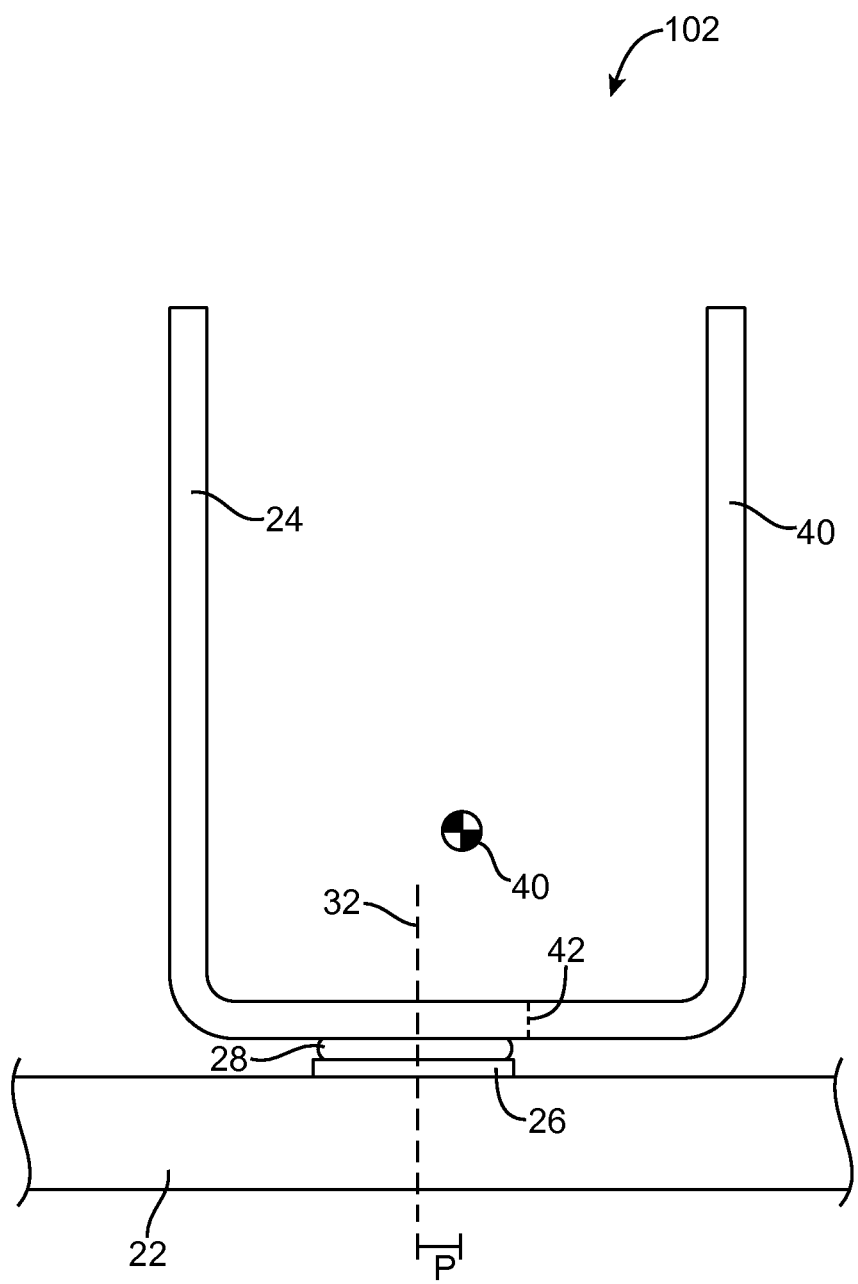
FIG. 7 is a side view of an illustrative component that is mounted to a printed circuit substrate using solder and is detachably connected to a breakaway support tab in accordance with an embodiment of the present invention.

FIG. 7 is a side view of reflow assembly 102 that includes component 24 and detachable support tab 40. By mechanically coupling support tab 40 to component 24, center of mass 40 of component 24 may be shifted towards central portion 32 of solder pad 26. In the example of FIG. 7, center of mass 40 of component 24 is offset from central portion 32 by a distance P, which may be less than distance D of FIG. 5 (e.g., the center of mass offset of reflow assembly 102 may be less than the center of mass offset of post-reflow assembly 100). This is, however, merely illustrative. If desired, balancing tab 40 may be configured such that the center of mass of component 24 is perfectly aligned with central portion 32 of solder pad 26.

Following reflow operations, component 24 may be securely mounted to printed circuit substrate 22. Balancing tab 40 may be severed at interface 42, thereby leaving the desired component in a post-reflow assembly such as post-reflow assembly 100 of FIGS. 4 and 5.

In the example of FIG. 7, balancing tab 40 mirrors the shape of component 24 (e.g., balancing tab 40 and component 24 each have an L-like shape, together forming a U-like shape which is symmetric about axis 32). This is merely illustrative. In general, balancing tab 40 may have any suitable shape (e.g., an S-like shape, a C-like shape, a wave-like shape, a planar shape, etc.)

Figure 8:
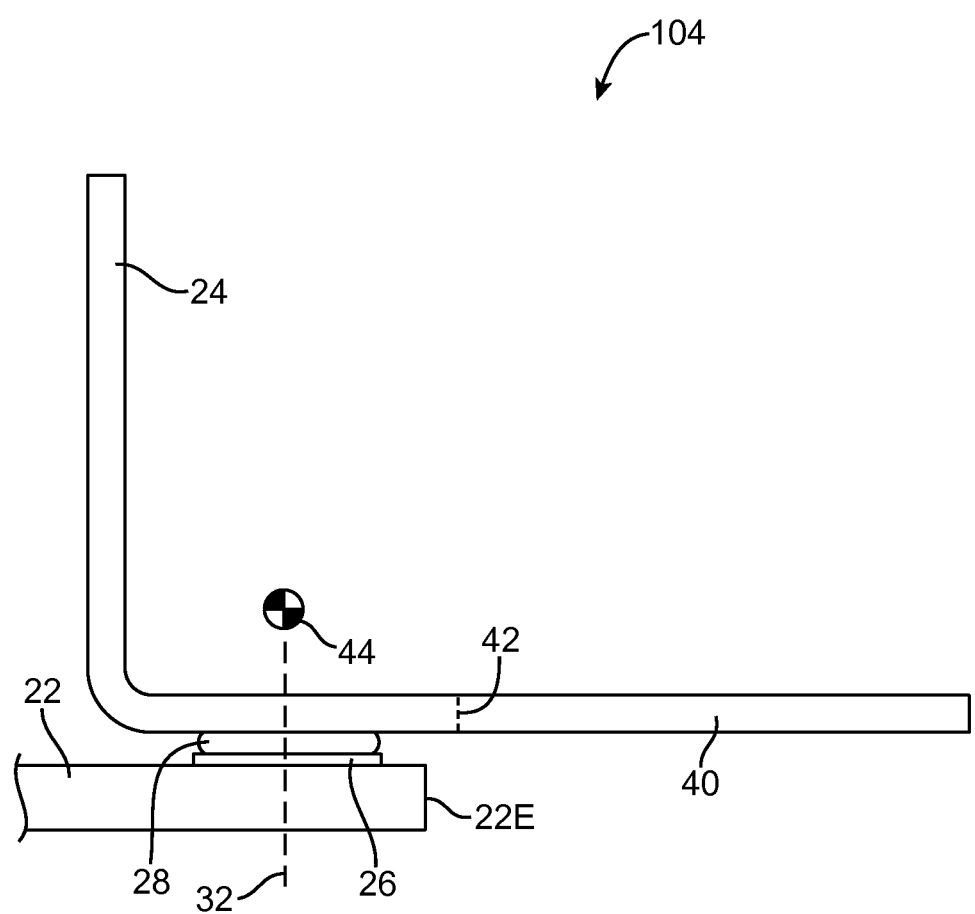
FIG. 8 is a side view of an illustrative component that is mounted to a printed circuit substrate using solder and is detachably connected to a breakaway support tab in accordance with an embodiment of the present invention.

FIG. 8 is a side view of reflow assembly 104 in which balancing tab 40 is substantially planar. As shown in FIG. 8, balancing tab 40 may align center of mass 44 of component 24 with central portion 32 of solder pad 26, thereby providing component 24 with increased stability during reflow. Following reflow operations, balancing tab 40 may be removed from component 24 by severing the connection at interface 42.

In the example of FIG. 8, interface 42 at which balancing tab 40 is severed is located beyond edge 22E of substrate 22 (e.g., such that interface 42 does not overlap substrate 22). This may ensure that solder does not come into contact with balancing tab 40 during reflow and that balancing tab 40 remains easily detachable. This is, however, merely illustrative. In general, interface 42 may be formed at any suitable location. For example, interface 42 may be formed at a location which overlaps substrate 22 (if desired).

In the example of FIGS. 6, 7, and 8, detachable support tab 40 may be used to shift the center of mass of a component during reflow operations to provide the component with greater stability as solder melts. Detachable support tab 40 may also be used to maintain a component's precise position on a printed circuit substrate. An illustrative reflow assembly in which a detachable support tab is used to fix a component in a precise location with respect to a printed circuit substrate during reflow is shown in FIG. 9.

Figure 9:
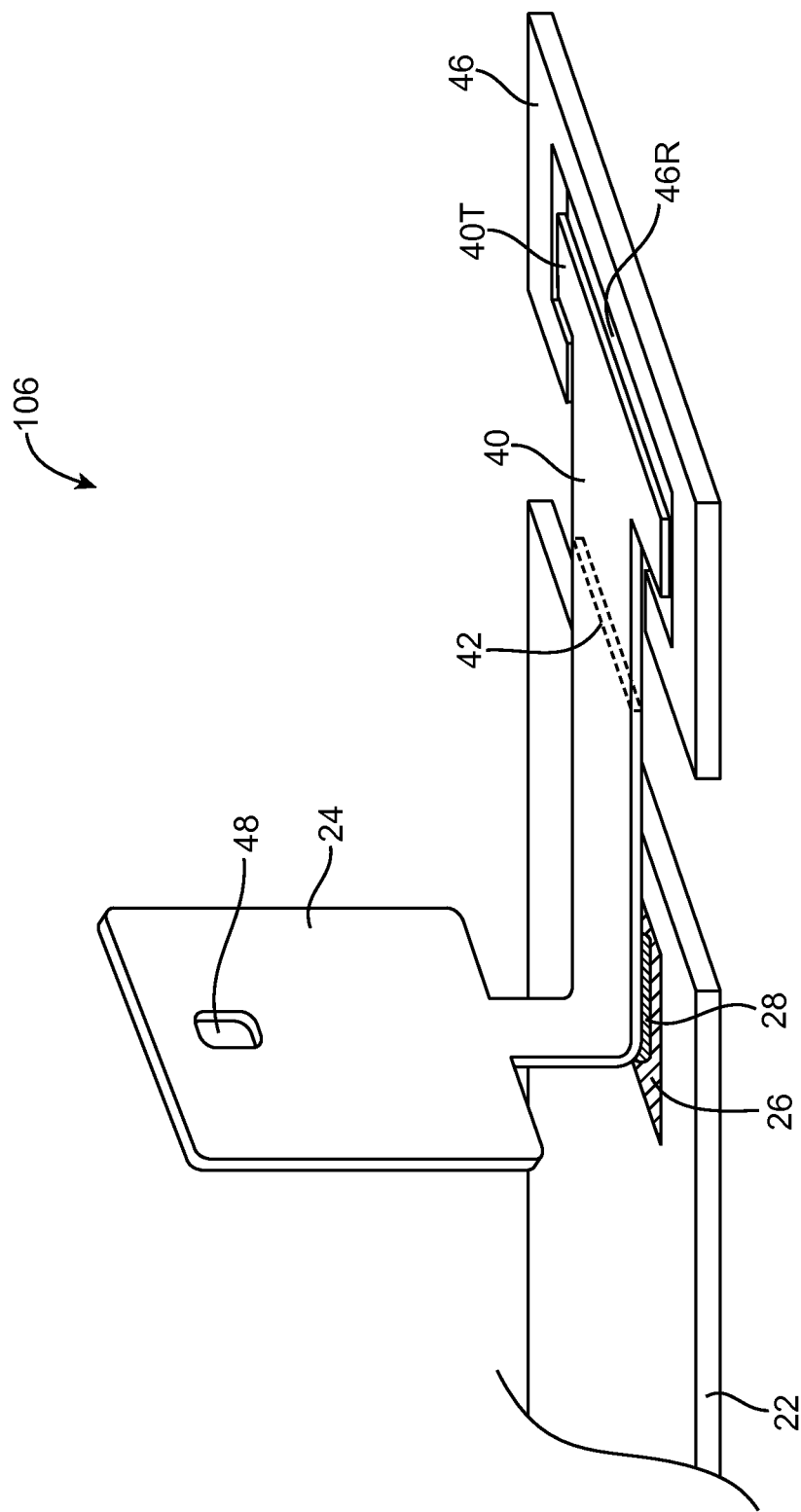
FIG. 9 is a perspective view of an illustrative component that is mounted to a printed circuit substrate using solder and is detachably connected to a breakaway support tab held in place by a fixture in accordance with an embodiment of the present invention.

Assembly 106 of FIG. 9 may include component 24 mounted on substrate 22 using solder 28. In the example of FIG. 9, component 24 is provided with an engagement feature such as opening 48. Opening 48 may be configured to receive a corresponding engagement feature or may be used for other suitable purposes. This is, however, merely illustrative. If desired, component 24 may be free of openings and/or may have other suitable shapes.

Component 24 may be provided with a support tab such as detachable support tab 40. Detachable support tab 40 may be held in place by a fixture such as fixture 46. For example, support tab 40 may include an engagement feature such as T-shaped end portion 40T. Fixture 46 may have a corresponding engagement feature such as tab receiving opening 46R. As shown in FIG. 9, opening 46R in fixture 46 may receive T-shaped end portion 50T of support tab 40, thereby attaching support tab 40 to fixture 46. This is, however, merely illustrative. If desired, other attachment mechanisms may be used to attach support tab 40 to fixture 46. Fixture 46 may be formed from any suitable material (e.g., metal, plastic, glass, other suitable materials, combinations of these materials, etc.).

Assembly 106 may be conveyed into a reflow oven to convert solder paste 28 into a solder connection with component 24. Because component 24 is attached to support tab 40, which is fixed by fixture 46, component 24 may remain in the same location with respect to substrate 22 during reflow. Following reflow operations, support tab 40 may be detached from component 24 by severing support tab 40 at interface 42, thereby leaving the desired component (component 24) securely mounted to substrate 22.

By mechanically coupling component 24 to a fixture such as fixture 46 during reflow operations, component 24 may be prevented from shifting during reflow as solder 28 melts. This type of placement precision may enhance the quality of a printed circuit assembly (e.g., by allowing components to be more densely populated on a substrate).

In the example of FIG. 9, component 24 is held in place by support tab 40, which is in turn held in place by fixture 46. This is merely illustrative. If desired, support tab 40 may be held in place by soldering a portion of support tab 40 to a fixed surface. For example, support tab 40 may be soldered to an unused portion of a substrate that passes through the reflow oven with substrate 22.

Figure 10:
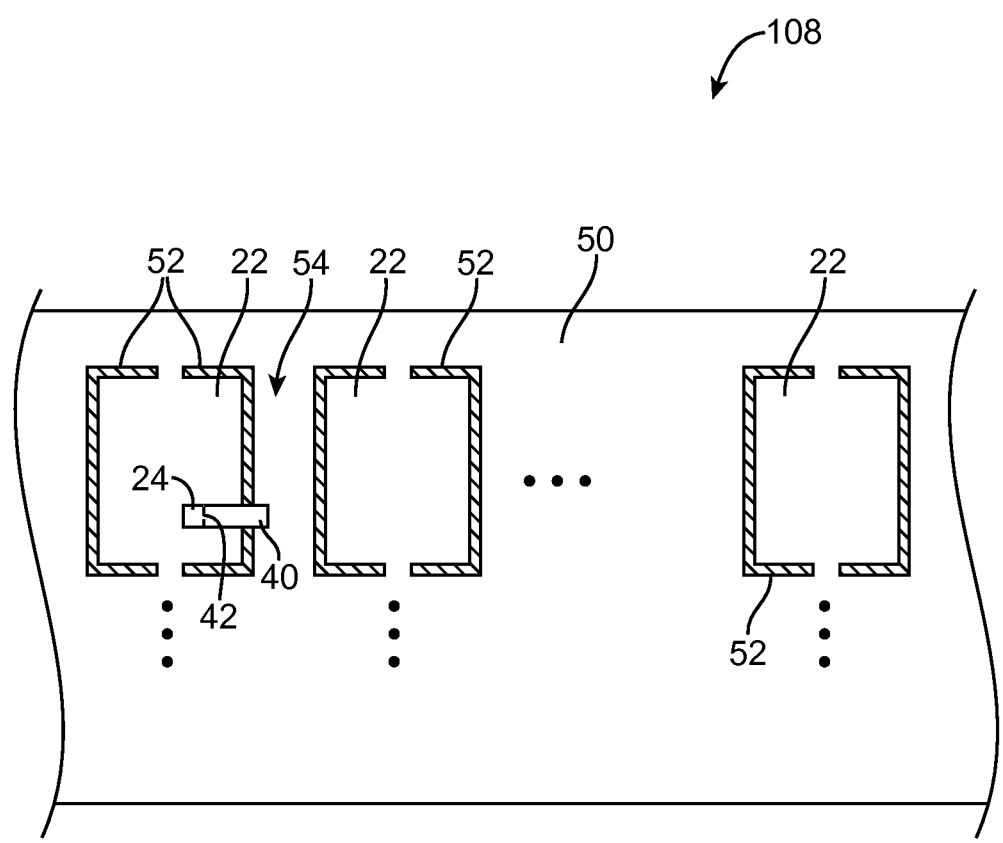
FIG. 10 is a top view of an illustrative panel of printed circuit substrates in which a breakaway support tab has a first portion detachably connected to a component and a second portion mounted to an unused portion of the panel in accordance with an embodiment of the present invention.

FIG. 10 is a top view of an illustrative configuration in which support tab 40 is soldered to an unused portion of a substrate that passes through the reflow oven with substrate 22. As shown in FIG. 10, assembly 108 may include a panel such as panel 50 that includes a cluster of printed circuits such as printed circuits 22. Each printed circuit 22 may be partially surrounded by holes 52. Holes 52 may allow printed circuits 22 to be easily depanelized (severed) from panel 50 after panel 50 has passed through a reflow oven.

Portions between substrates 22 such as portions 54 may be unused portions which are discarded or which are otherwise not used after substrates 22 are depanelized. As shown in FIG. 10, support tab 40 may have a first portion detachably connected to component 24 (at interface 42) and a second portion which is attached to unused portion 54 of panel 50. As assembly 108 is passed through a reflow oven, support tab 40 may ensure that component 24 remains in the same location on printed circuit substrate 22 during the reflow process. Following reflow operations, substrate 22 may be depanelized and support tab 40 may be severed from component 24 at interface 42.

Figure 11:
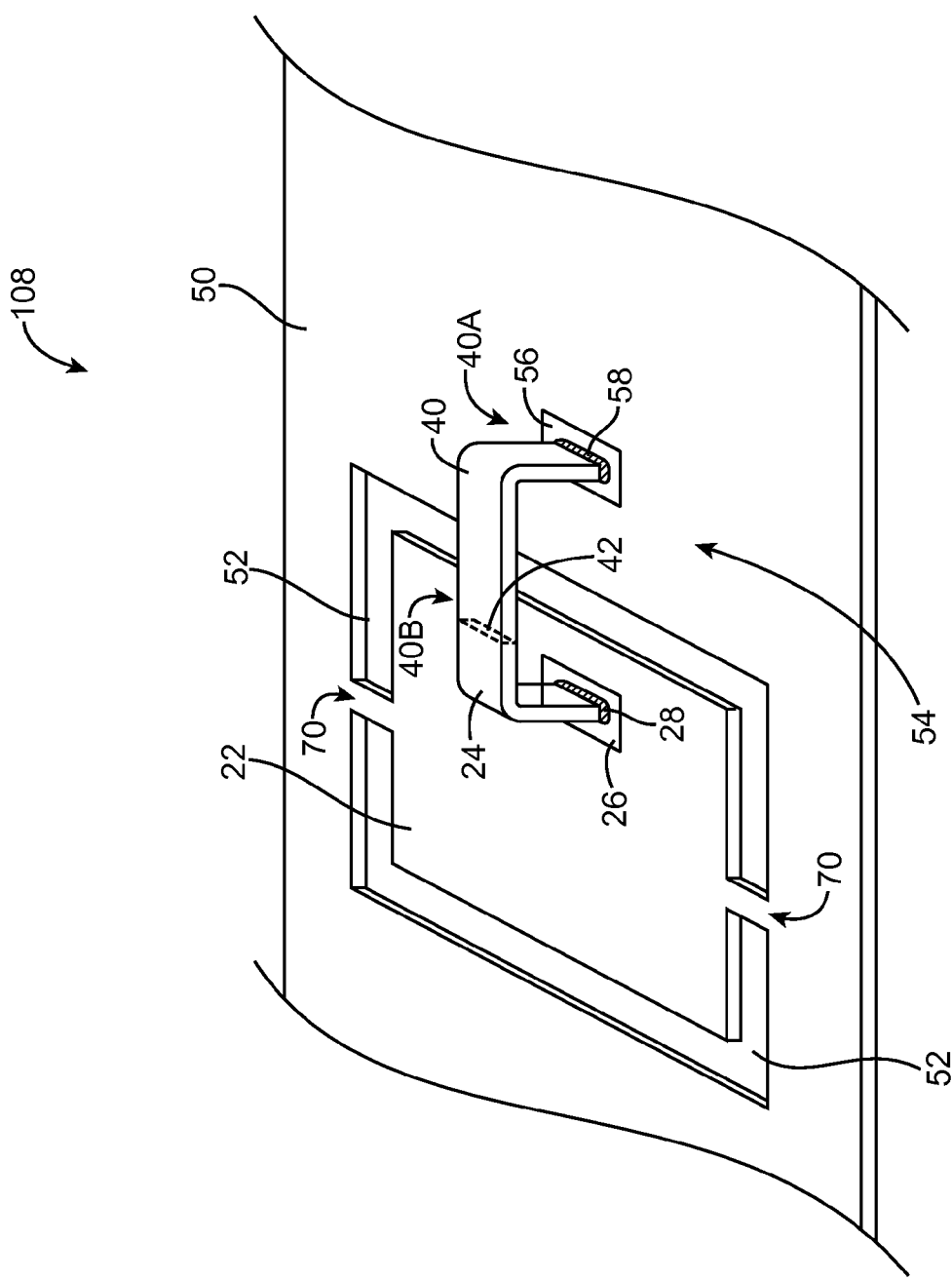
FIG. 11 is a perspective view of the arrangement shown in FIG. 10 in accordance with an embodiment of the present invention.

FIG. 11 is a perspective view of assembly 108 showing how detachable support tab 40 may be mounted to unused portion 54 of panel 50. As shown in FIG. 11, a solder pad such as solder pad 56 may be formed on unused surface 54 of panel 50. End portion 40A of support tab 40 may be attached to solder pad 56 using solder paste such as solder paste 58, whereas end portion 40B of support tab 40 may be detachably connected to component 24 at interface 42.

Detachable support tab 40 may provide stability and support for component 24 during reflow operations and may prevent component 24 from shifting with respect to substrate 22 during reflow operations. Component 24 may, for example, have a relatively low amount of bonding area (i.e., may have a relatively small portion which is soldered to substrate 22), and may therefore benefit from the support provided by support tab 40 as panel 50 is conveyed into a reflow oven. Following reflow operations, substrate 22 may be depanelized by cutting or severing connecting portions 70 to separate substrate 22 from panel 50. Once substrate 22 has been depanelized, support tab 40 may be severed from component 24 at interface 42.

Figure 12:
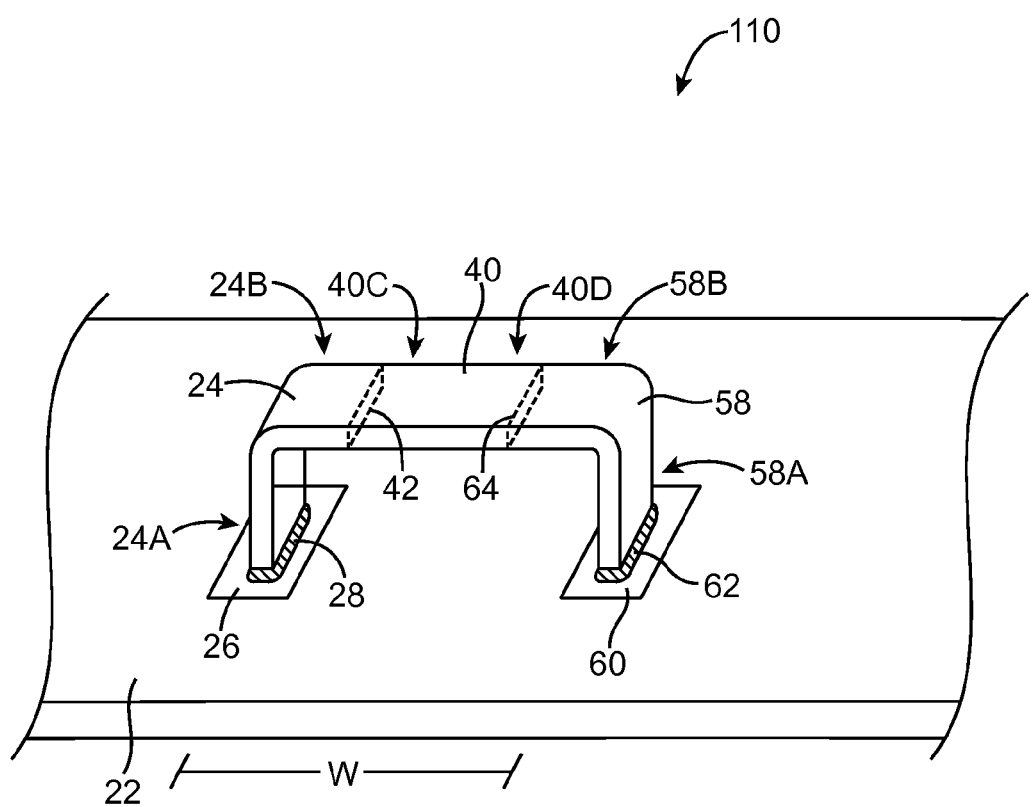
FIG. 12 is a perspective view of an illustrative pair of components that are mechanically coupled together by a breakaway support tab in accordance with an embodiment of the present invention.

In another suitable embodiment, two or more components may be connected during reflow operations by a detachable support tab. FIG. 12 is a perspective view of an illustrative reflow assembly in which component 24 and component 58 are mechanically coupled together by detachable support tab 40. Components 24 and 58 may be any suitable type of component (e.g., clips, stiffeners, connectors, attachment features, engagement members, other structures, etc.). As shown in reflow assembly 110 of FIG. 12, component 24, support tab 40, and component 58 may be surface mounted to printed circuit substrate 22 as a single part. Component 24 may have a first portion such as portion 24A mounted to solder pad 26 using solder paste 28. Component 24 may have a second portion such as portion 24B attached to support tab 40 at interface 42. Component 58 may have a first portion such as portion 58A mounted to solder pad 60 using solder paste 62. Component 58 may have a second portion such as portion 58B attached to support tab 40 at interface 64. Support tab 40 may have a first portion such as portion 40C attached to component 24 at interface 42 and a second portion such as portion 40D attached to component 58 at interface 64.

Component 24, support tab 40, and component 58 may be formed from a single structure (e.g., from a single piece of sheet metal). This is, however, merely illustrative. If desired, component 24, support tab 40, and component 58 may be formed from separate structures that are attached together at interfaces 42 and 64 and/or may be formed from different materials.

By mechanically coupling component 24 with component 58 using support tab 40, a distance such as distance W may be maintained between components 24 and 58 during reflow operations (e.g., as solder paste 28 and 62 begins to melt). Additionally, in arrangements where component 24 and/or component 58 have relatively small bonding area, support tab 40 may be used in providing support and stability for components 24 and 58 during reflow. Following reflow operations, support tab 40 may be detached from components 24 and 58 by severing support tab 40 at interfaces 42 and 64, thereby leaving components 24 and 58 on substrate 22 separated by distance W. With this type of arrangement, the precise distance between components may be determined prior to the surface mounting process and may be maintained throughout reflow operations.

Figure 13:
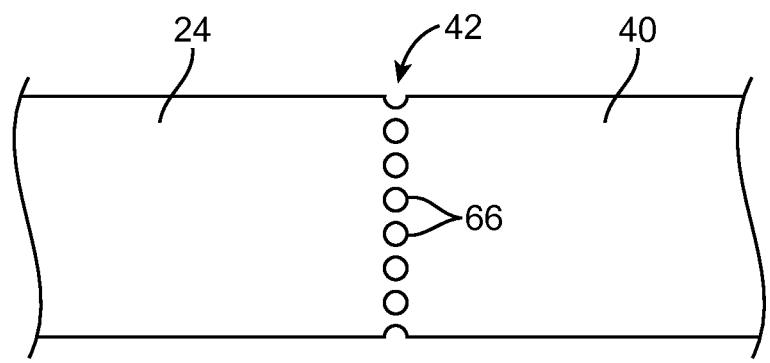
FIG. 13 is a top view of a component and a breakaway support tab that are linked by a perforated interface in accordance with an embodiment of the present invention.

FIG. 13 is a top view a portion of component 24 and detachable support tab 40 showing how support tab 40 may be attached to component 24 at interface 42. As shown in FIG. 13, interface 42 that links component 24 with support tab 40 may be provided with openings such as openings 66. Openings 66 (sometimes referred to as holes or perforations) may have any suitable size and may be formed along interface 42 using any suitable hole-forming process (e.g., perforating, punching, stamping, laser-cutting, etc.). Openings 66 may allow detachable support tab 40 to be easily torn or broken away from component 24 following reflow operations. For example, detachable support tab 40 may be detached from component 24 by severing support tab 40 along perforations 66.

Figure 14:
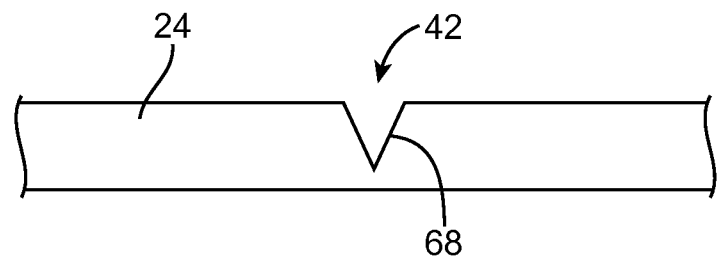
FIG. 14 is a side view of a component and a breakaway support tab that are linked by a half sheared interface in accordance with an embodiment of the present invention.

FIG. 14 is a side view of a portion of component 24 and detachable support tab 40 showing another suitable embodiment for providing support tab 40 with breakaway capabilities. As shown in FIG. 14, interface 42 that links component 24 with support tab 40 may be provided with a notch such as V-shaped notch 68. Notch 68 may be formed by partially piercing through support tab 40 at interface 42 (sometimes referred to as half shearing). Notch 68 may allow detachable support tab 40 to be easily torn away from component 24 following reflow operations. For example, detachable support tab 40 may be detached from component 24 by severing support tab 40 along notch 68.

Figure 15:
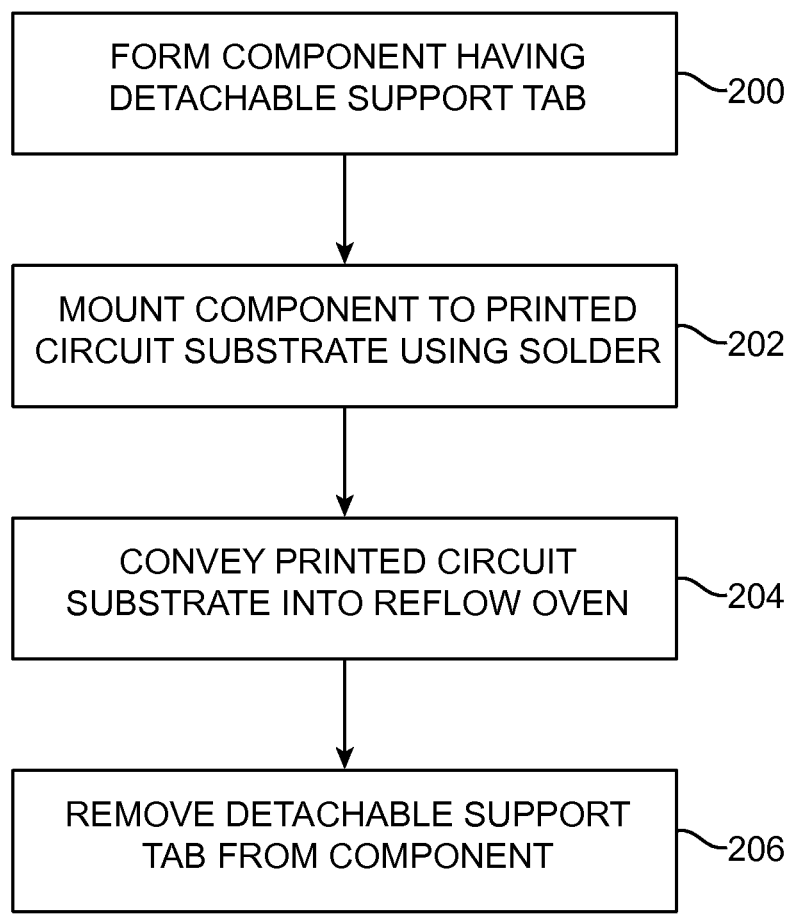
FIG. 15 is a flow chart of illustrative steps involved in mounting a component to a printed circuit substrate using a breakaway support tab in accordance with an embodiment of the present invention.

FIG. 15 is a flow chart of illustrative steps involved in mounting a component to a printed circuit substrate using a detachable support tab such as detachable support tab 40.

At step 200, a component such as component 24 may be formed with a detachable support tab such as detachable support tab 40. This may include, for example, forming component 24 and detachable support tab 40 from a single piece of sheet metal. Detachable support tab 40 may be provided with breakaway capabilities by perforating or half shearing the interface that links the component to the detachable support tab.

At step 202, component 24 may be mounted to the surface of a printed circuit substrate such as printed circuit substrate 22 (e.g., a flexible printed circuit substrate, a rigid printed circuit board, or a rigid-flex printed circuit substrate). This may include forming solder pads on the surface of the printed circuit substrate, depositing solder paste on the solder pads, and attaching the component to the solder paste using a pick and place tool.

At step 204, the reflow assembly that includes component 24 and detachable support tab 40 mounted on printed circuit substrate 22 may be conveyed into a reflow oven to convert the solder paste into solder connections. This is, however, merely illustrative. If desired, other techniques may be used to reflow solder on substrate 22 (e.g., using a localized heat source such as a heat bar or heat gun, using other suitable solder reflow techniques, etc.). Because component 24 is stabilized by detachable support tab 40, component 24 may be prevented from shifting with respect to substrate 22 or from toppling over during reflow as solder melts.

At step 206, substrate 22 may be removed from the reflow oven and detachable support tab 40 may be separated from component 24, thereby leaving the desired component securely mounted in the desired location (as shown in FIG. 4, for example). This may include, for example, bending, breaking, or severing support tab 40 at interface 42 along perforations 66 (FIG. 13) or notch 68 (FIG. 14).

Figure 16:
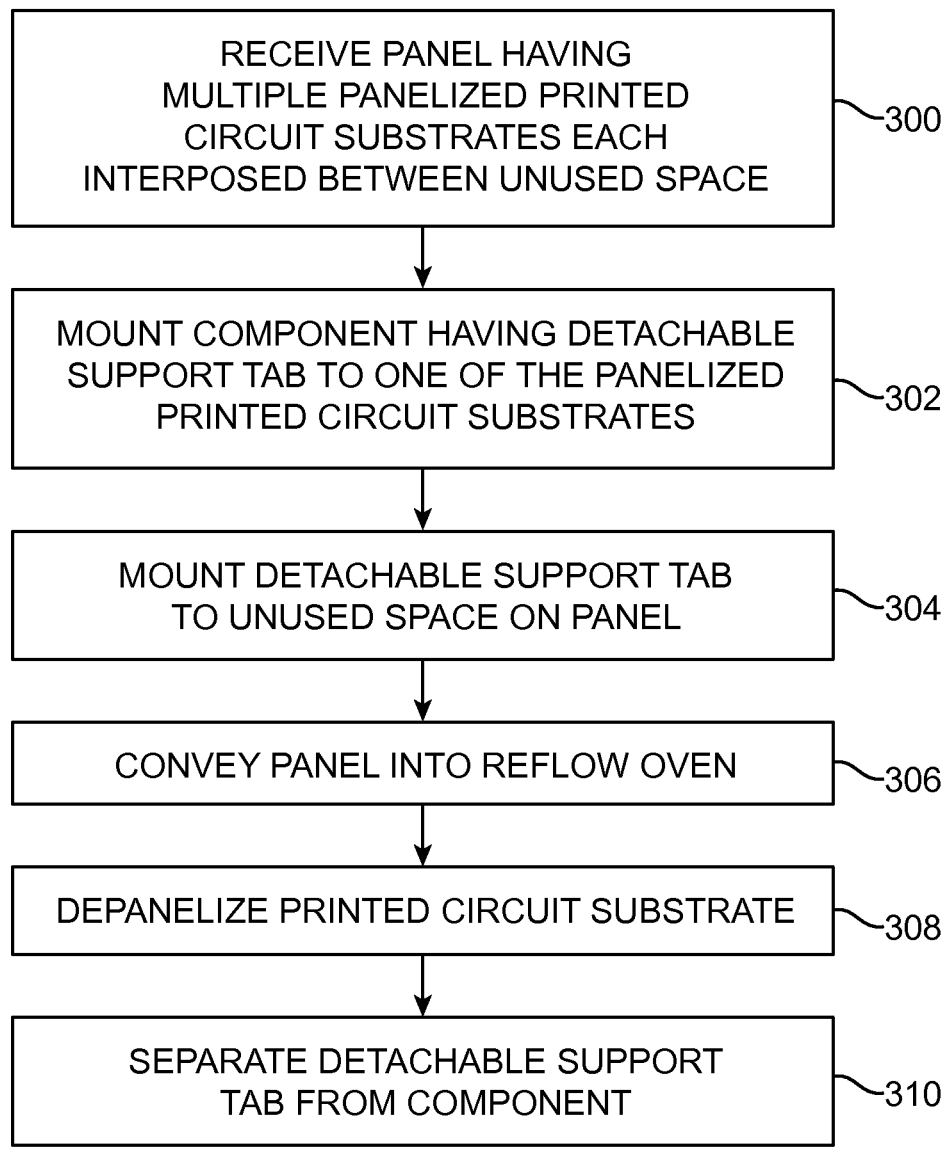
FIG. 16 is a flow chart of illustrative steps involved in mounting components to panelized printed circuit substrates using breakaway support tabs in accordance with an embodiment of the present invention.

FIG. 16 is a flow chart of illustrative steps involved in mounting components to panelized printed circuit substrates using detachable support tabs such as detachable support tab 40.

At step 300, a panel such as panel 50 having multiple panelized printed circuit substrates 22 may be received. Each printed circuit substrate 22 in panel 50 may be interposed between unused space (e.g., unused space 54 of FIG. 10). The unused space may be portions of panel 50 that do not form part of individual printed circuit substrates 22 in panel 50.

At step 302, a component such as component 24 having detachable support tab 40 maybe mounted to one of the panelized printed circuit substrates. This may include, for example, forming solder pads on the surface of the printed circuit substrate, depositing solder paste on the solder pads, and attaching the component to the solder paste using a pick and place tool.

At step 304, detachable support tab 40 may be mounted to an unused portion of panel 50 (e.g., unused portion 54 adjacent to substrate 22 on which component 24 is mounted). This may include, for example, forming a solder pad on the unused surface of the panel, depositing solder paste on the solder pad, and attaching the detachable support tab to the solder paste using a pick and place tool. If desired, step 302 and step 304 may be performed simultaneously (e.g., a pick and place tool may be used to surface mount component 24 and support tab 40 simultaneously as a single part).

At step 306, the panel of printed circuit substrates that includes components such as component 24 and support tab 40 may be conveyed into a reflow oven to convert the solder paste into solder connections. If desired, other techniques may be used to reflow solder on substrate 22 (e.g., using a localized heat source such as a heat bar or heat gun, using other suitable solder reflow techniques, etc.). Because component 24 is stabilized by detachable support tab 40, component 24 may be prevented from shifting with respect to substrate 22 or from toppling over during reflow as solder melts.

At step 308, printed circuit substrates 22 may be depanelized from panel 50. This may include cutting or severing substrate 22 from panel 50 (e.g., by cutting trough or breaking away connecting portions 70 of FIG. 11), thereby separating substrate 22 from panel 50.

At step 310, detachable support tab 40 may be separated from component 24, thereby leaving the desired component securely mounted in the desired location). This may include, for example, bending, breaking, or severing support tab 40 at interface 42 along perforations 66 (FIG. 13) or notch 68 (FIG. 14). The example in which printed circuit substrates 22 are depanelized (step 308) before support tab 40 is severed (step 310) is merely illustrative. If desired, support tab 40 may be severed from component 24 before printed circuit substrate 22 is depanelized from panel 50.

The foregoing is merely illustrative of the principles of this invention and various modifications can be made by those skilled in the art without departing from the scope and spirit of the invention.

What is claimed is:

1. Apparatus, comprising:
    a printed circuit substrate;
    a component mounted to the printed circuit substrate using solder;
    a breakaway support tab detachably connected to the component and configured to prevent the component from shifting with respect to the printed circuit substrate during solder reflow operations; and
    a solder pad, wherein the component is mounted on the solder pad and wherein the breakaway support tab is configured to align the center of mass the component with the solder pad.

2. The apparatus defined in claim 1 further comprising a perforated interface interposed between the component and the breakaway support tab.

3. The apparatus defined in claim 1 further comprising a notch interposed between the component and the breakaway support tab.

4. The apparatus defined in claim 1 wherein the component and the breakaway support tab each comprise sheet metal.

5. The apparatus defined in claim 1 further comprising an additional component mounted to the printed circuit substrate using additional solder, wherein the breakaway support tab is detachably connected to the additional component and is configured to maintain a distance between the component and the additional component during solder reflow operations.

6. The apparatus defined in claim 1 further comprising a fixture configured to receive a portion of the breakaway support tab and to hold the breakaway support tab in place with respect to the printed circuit substrate during reflow operations.

7. The apparatus defined in claim 1 wherein the printed circuit substrate is a flexible printed circuit substrate.

8. The apparatus defined in claim 1 wherein the component comprises an opening configured to receive an engagement member.

9. Apparatus, comprising:
    a panel having a plurality of printed circuit substrates interposed between unused portions;
    a component mounted to a respective one of the printed circuit substrates in the plurality of printed circuit substrates; and
    a support structure mounted to a respective one of the unused portions, wherein a perforated interface is interposed between the component and the support structure such that the support structure is detachably connected to the component and is configured to stabilize the component with respect to the respective one of the printed circuit substrates in the plurality of printed circuit substrates during solder reflow operations.

10. The apparatus defined in claim 9 wherein the component and the support structure each comprise sheet metal.

11. The apparatus defined in claim 9, wherein the panel comprises polyimide.

12. The apparatus defined in claim 9 further comprising a plurality of openings in the panel, wherein each opening in the plurality of openings at least partially surrounds an associated printed circuit substrate in the plurality of printed circuit substrates.

13. A method for mounting a component to a printed circuit substrate, comprising:
- attaching the component to a surface of the printed circuit substrate using solder paste;
- conveying the printed circuit substrate into a reflow oven;
- using a detachable support tab that is mechanically coupled to the component to stabilize the component with respect to the printed circuit substrate while the printed circuit substrate is in the reflow oven; wherein the component and the detachable support tab are formed from a single piece of sheet metal; and
- detaching the detachable support tab from the component.

14. The method defined in claim 13 further comprising:
- forming the component and the detachable support tab, wherein forming the component and the detachable support tab comprises perforating an interface that links the component to the detachable support tab.

15. The method defined in claim 13 further comprising:
- forming the component and the detachable support tab, wherein forming the component and the detachable support tab comprises half shearing an interface that links the component to the detachable support tab.

16. The method defined in claim 13 further comprising:
- removing the printed circuit substrate from the reflow oven, wherein detaching the detachable support tab from the component comprises detaching the detachable support tab from the component after removing the printed circuit substrate from the reflow oven.

17. The method defined in claim 13 wherein detaching the detachable support tab from the component comprises breaking a perforated interface that links the component to the detachable support tab after conveying the printed circuit substrate into the reflow oven.

* * * * *